(12) United States Patent
Weng et al.

(10) Patent No.: US 8,022,540 B2
(45) Date of Patent: Sep. 20, 2011

(54) CHIP PACKAGE

(75) Inventors: Wen Pin Weng, Taipei (TW); Wen Hui Ko, Taipei (TW)

(73) Assignee: Lunghwa Univerity Of Science and Technology, Taoyuan County (TW)

( * ) Notice: Subject to any disclaimer, the term of this patent is extended or adjusted under 35 U.S.C. 154(b) by 0 days.

(21) Appl. No.: 12/325,289

(22) Filed: Dec. 1, 2008

(65) Prior Publication Data

US 2009/0140425 A1    Jun. 4, 2009

Related U.S. Application Data

(60) Provisional application No. 60/991,728, filed on Dec. 2, 2007.

(51) Int. Cl.
*H01L 23/488* (2006.01)

(52) U.S. Cl. . 257/738; 257/734; 257/781; 257/E23.023; 257/E23.178

(58) Field of Classification Search .................. 257/738, 257/E23.023, E23.178, 734, 781
See application file for complete search history.

(56) References Cited

U.S. PATENT DOCUMENTS

| 6,392,898 | B1 * | 5/2002 | Asai et al. ...................... | 361/794 |
| 2003/0127742 | A1 * | 7/2003 | Sankman ...................... | 257/758 |
| 2004/0195686 | A1 * | 10/2004 | Jobetto et al. ................. | 257/734 |
| 2004/0256737 | A1 * | 12/2004 | Huang et al. .................. | 257/778 |
| 2006/0244142 | A1 * | 11/2006 | Waidhas et al. ............... | 257/738 |
| 2007/0221400 | A1 * | 9/2007 | Kurashina et al. ............ | 174/255 |
| 2007/0222072 | A1 * | 9/2007 | Chang et al. .................. | 257/737 |

* cited by examiner

*Primary Examiner* — Eugene Lee
*Assistant Examiner* — Peniel M Gumedzoe

(57) ABSTRACT

The present provides the improved structure of a chip package, comprising an electrical contact surface of at least a chip configured with a under fill layer, the first solder mask layer, the first metal layer, dielectric material layer, the second metal layer, the second solder mask layer, and metal ball layer, characterized in the electrical contact surfaces among the first metal layer, the second metal layer, and the chip accomplish the electrical connection by employing the contacts of the surfaces of the conducting layers.

4 Claims, 3 Drawing Sheets

CHIP PACKAGE

FIELD OF THE INVENTION

The present invention relates to an improved structure of a chip package, particularly to a transistor package structure for reducing electromagnetic wave interference, increasing the transportation speed, and improving the package yield.

BACKGROUND OF THE INVENTION

The conventional transistor package structure is classified to three types. The first type is shown as FIG. 1. It is so-called Turbo CSP, and its configuration comprises the first adhesion layer 11, metal layer 12, the second adhesion layer 13, and lead frame 14 in order in the electrical contact surface of the chip 10. The electrical contact and the metal layer 12 of the chip 10 form the electrical connection with the lead frame 14 respectively b employing multiple metal wires 15 to be the main structure characteristic. The transistor comprising this kind of structure characteristic usually includes the drawbacks of slow transportation sped and high defect rate of the package, because the metal wires 15 connecting the chip 10, metal layer 12, and the lead frame 14 are too long and they are point-to-point connections.

The second type of the transistor package structure is shown as FIG. 2, which is so-called Window BGA and its configuration comprises the adherent layer 21, metal layer 22, and solder 23 in order on the electrical contact surface of the chip 20, and employs the metal wires 24 to electrically connect the chip 20, and metal layer 22. But because the kind of transistor package structure only comprises single metal layer 22, signal wire layer and the ground power layer needed by the transistor are both configured in the metal layer 22 in the manufacture procedure. When manufacturing memory with big capacity and numerous wires, the space between wires becomes very tight so that the drawback that the electromagnetic wave interference cannot be reduced happens. And the mental wires 24 electrically connects the chip 20 and the metal layer 22 are too long and the structure is in the manner of point-to-point can also cause the drawbacks of the very slow transportation speed and very high defect rate of the package.

The third type of the transistor package structure is shown in FIG. 3, which is so-called T2BGA. Its difference from the Window BGA is that the T2BGA comprises two metal layers 31 to separate the signal wire layer and the ground power layer for configuration. It performs the better effect of electromagnetic interference compared with the Window BGA. But the T2BGA also needs the metal wires 32 electrical connects the chip 20 and the two metal layer 31. The structure mentioned above can also cause the drawbacks of the very slow transportation speed and very high defect rate of the package.

Therefore, in order to resolve the drawbacks of the several transistors package structure mentioned above, the inventor of the present invention develops a dielectric material layer connected to the electric conducting object and a bump. In the manner of big-area electrical connection by the contact of the surfaces, the dielectric material electrical connected to the first metal layer can accomplish the improvement of the chip package structure which performs the better insulation of the electric noise, the better effect for reducing the electromagnetic interference, the higher transportation speed, and higher yield of the package.

SUMMARY OF THE INVENTION

The improved structure of the chip package of the present invention mainly employs the electron conducting structure forms the face-to-face electrical connection among the first metal layer, the second layer, and the electrical contact surface of a chip, so as to perform the better insulation of the electric noise, the better effect for reducing the electromagnetic interference, the higher transportation speed, and higher yield of the package.

DETAILED DESCRIPTION OF PREFERRED EMBODIMENTS

Figure 1:
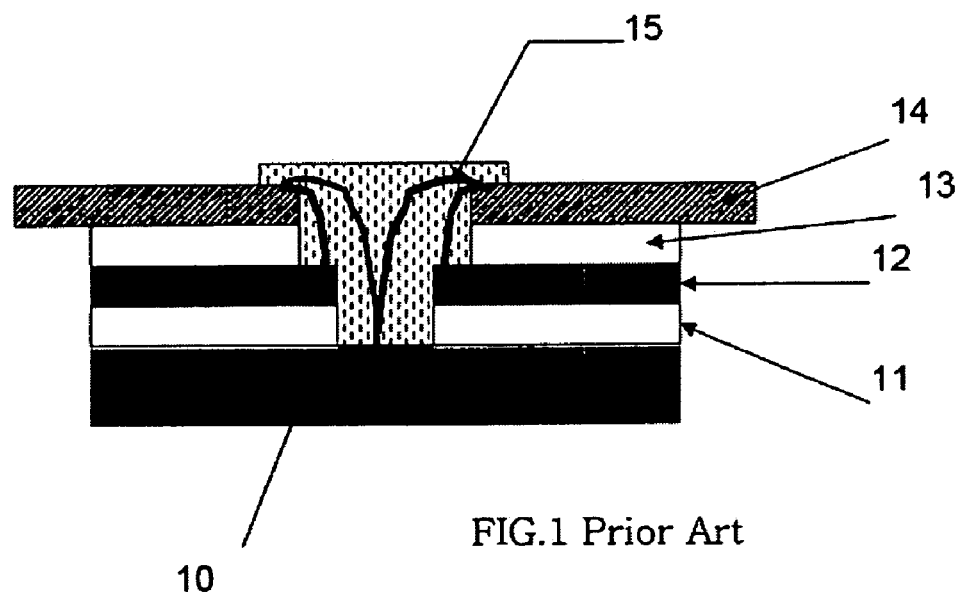
FIG. 1 is the cross section diagram of the conventional Turbo CSP transistor structure.
Figure 2:
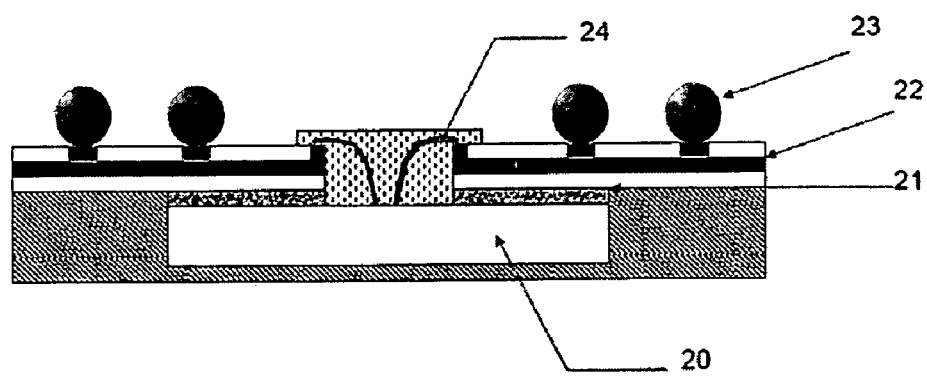
FIG. 2 is the cross section diagram of the conventional Window BGAP transistor structure.
Figure 3:
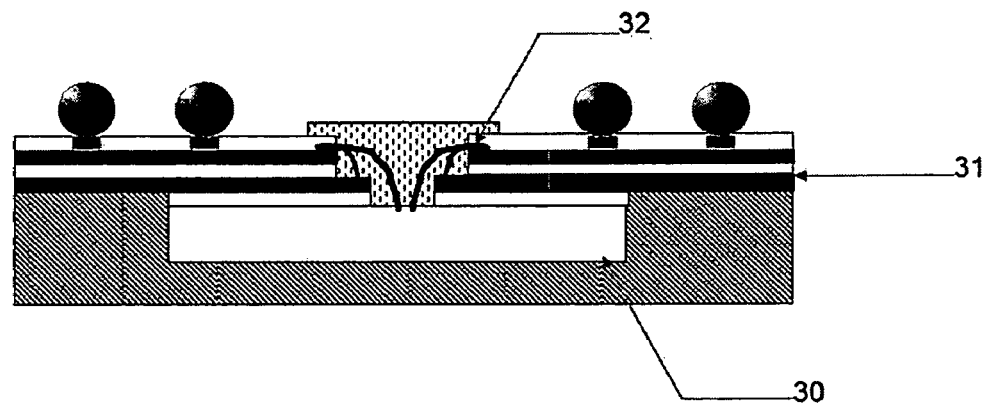
FIG. 3 is the cross section diagram of the conventional Turbo T2BGA transistor structure.
Figure 4:
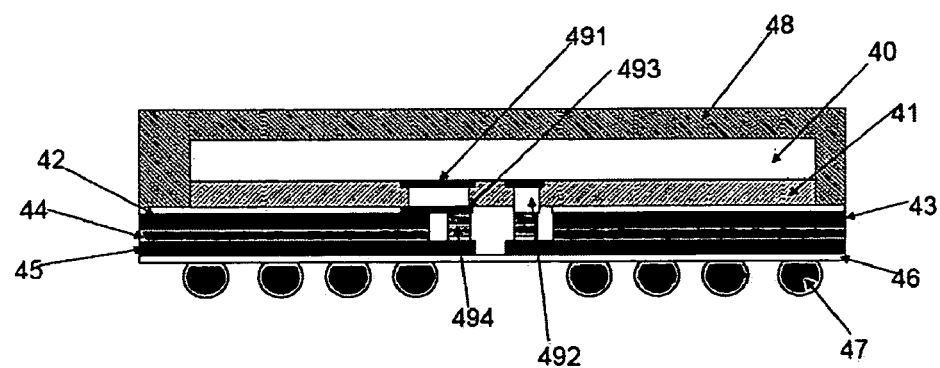
FIG. 4 is the cross section diagram of the present invention.

The attached figures of the embodiments describe the structure features, and other function, purpose in detail as the following:

Referring to FIG. 4, it comprises a chip 40, under fill layer 41, the first solder mask layer 42, the first metal layer 43, dielectric material layer 44, the second metal layer 45, the second solder mask layer 46, metal ball layer 47, and the external packing-glue structure 48, wherein:

The selectable surface of the chip 40 includes the electrical contact (not shown). The layer which is connected to the electrical contact is the under fill layer 41. The under fill layer 41 is made of elastic material for reducing the thermal stress caused by heat-inflation and chill-shrinking between the chip 40 and the metal layer 43 for reducing the damage probability of the surface of the chip 40.

At the side of the other surface of the under fill layer 41, which is not connected to the electrical contact of the chip 40, the layers are configured as the order of the following: the first solder mask layer 42, the first metal layer 43, dielectric material layer 44, the second metal layer 45, the second solder mask layer 46, and the metal ball layer 47. The dielectric material layer 44 is disposed between the first metal layer 43 and the second metal layer 45.

As the mention above, the first solder mask layer 42 and the second solder mask layer 46 may be the material which is liquid and becomes adhesive to fasten objects after drying (such as glue) or adhesive tape. The first metal layer 43 and the second metal layer 45 may be made by various electron conducting materials, such as metal plates, metal films, or electron conducting fibers. With respect to functionality, one is for ground power layer, and another is for signal wire layer. Therefore, it can reduced the electromagnetic wave inference situation effectively.

Besides, the electrical contact surface of the interval between the second metal layer 45 and the chip 40 is connected by multiple electron conducting structures 49. The electron conducting structure 49 is configured by the metal contact layer 491, the first metal conductor 492, electricity receiver layer 493, and the second metal conductor 494 in order to be connected. The first metal conductor 492 and the second metal conductor 494 are hollow objects. There are metal conducting materials to fill the hollow spaces. The electron conducting structures 49 are used to connecting the first metal layer 43, the second metal layer 45, and the electrical contact surface of the chip 40 to be electrically connected. Because the connections between the first metal conductor 492 and the second metal conductor 494, and among the first metal layer 43, the second metal layer and chip 40 are the connections of the surface and surface, it provides better connection and conductivity compared with the point-to-point connection of the conventional metal wires. Furthermore, because of the expansion of the connecting surface, it can improve the electrical transportation. Besides, because the electrical connection is the surface-to-surface contact, the contact space is much bigger than the point-to-surface contact of the metal wires. It is not easy to shit the contact positions in the packaging process so as to improve the package yield of the transistor.

Figure 5:
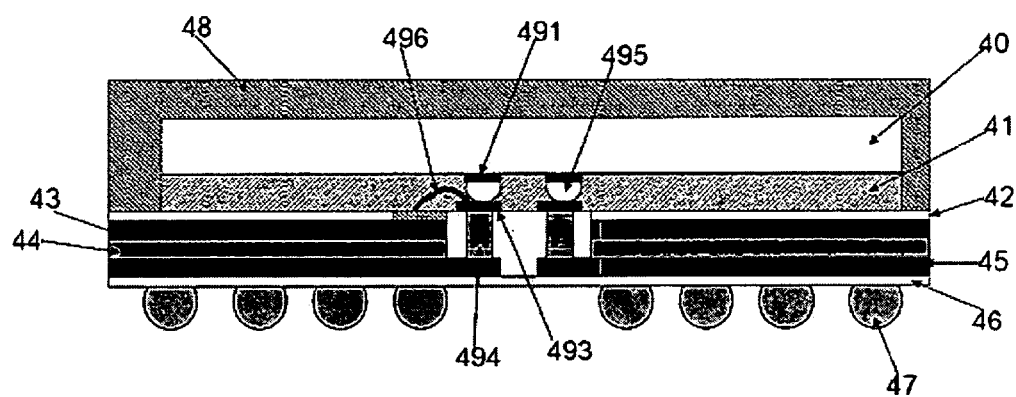
FIG. 5 is the cross section diagram of the other embodiment of the present invention.

Referring to FIG. 5, it is an embodiment of the present invention, the first metal conductor 492 is replaced by the metal bump 495, and the metal wire 496 is used to connect the metal bump 495 and the first metal layer 43 for electrical connection.

To sum up, the improvement of the chip package structure of the invention provides the utility and non-obviousness, and the performing method provides the novelty. Its function and the purpose of design are totally patentable. Accordingly, the applicant file it for apply patent application.

What is claim is:

1. An improved structure of chip packaging, comprising:
   a plurality of layers, orderly comprising a chip, an under fill layer, a first solder mask layer directly connected to the under fill layer, a first metal layer directly connected to the first solder mask, a dielectric material layer directly connected to the first metal layer, a second metal layer directly connected to the dielectric material layer, a second solder mask layer directly connected to the second metal layer, and a metal ball layer directly connected to the second solder mask layer; and
   a conducting structure electrically connecting the first metal layer and the second metal layer, the conducting structure being directly connected to the chip.

2. The improved structure according to claim 1, wherein the conducting structure comprises a metal contact layer, a first metal conductor, an electricity receiver layer, and a second metal conductor.

3. The improved structure according to claim 2, wherein the first metal conductor and the second metal conductor each comprises a hollow structure filled by metal conducting material.

4. The improved structure according to claim 2, wherein the first metal conductor comprises a metal bump, connected to the first metal layer by a metal wire for electrical connection.

* * * * *